US011081031B2

(12) United States Patent
Wang et al.

(10) Patent No.: US 11,081,031 B2
(45) Date of Patent: Aug. 3, 2021

(54) GATE CONTROL UNIT, DRIVING METHOD THEREOF, GATE DRIVER ON ARRAY AND DISPLAY APPARATUS

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventors: Hui Wang, Beijing (CN); Xiaoming Meng, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 243 days.

(21) Appl. No.: 16/085,769

(22) PCT Filed: Mar. 15, 2018

(86) PCT No.: PCT/CN2018/079126
§ 371 (c)(1),
(2) Date: Sep. 17, 2018

(87) PCT Pub. No.: WO2019/033750
PCT Pub. Date: Feb. 21, 2019

(65) Prior Publication Data
US 2020/0302845 A1 Sep. 24, 2020

(30) Foreign Application Priority Data
Aug. 16, 2017 (CN) .......................... 201710700666.1

(51) Int. Cl.
G09G 3/36 (2006.01)
G09G 3/20 (2006.01)
G11C 19/28 (2006.01)

(52) U.S. Cl.
CPC ............... *G09G 3/20* (2013.01); *G11C 19/28* (2013.01); *G09G 2300/0408* (2013.01);
(Continued)

(58) Field of Classification Search
CPC ....... G09G 2310/02; G09G 2310/0245; G09G 2310/06; G09G 2310/061; G09G 2320/0223; G09G 3/3677
See application file for complete search history.

(56) References Cited

U.S. PATENT DOCUMENTS

| 8,810,499 B2 * | 8/2014 | Shang ................... G11C 19/28 345/100 |
| 2002/0080108 A1 * | 6/2002 | Wang ................... G09G 3/3677 345/90 |
| 2006/0038767 A1 | 2/2006 | Nakamura et al. |
| 2006/0267909 A1 * | 11/2006 | Hsu ..................... G09G 3/3677 345/100 |

(Continued)

FOREIGN PATENT DOCUMENTS

| CN | 102881248 A | 1/2013 |
| CN | 103426414 A | 12/2013 |

(Continued)

OTHER PUBLICATIONS

International Search Report dated Jun. 19, 2018, issued in counterpart International Application No. PCT/CN2018/079126. (10 pages).
(Continued)

Primary Examiner — Ram A Mistry
(74) Attorney, Agent, or Firm — Westerman, Hattori, Daniels & Adrian, LLP

(57) ABSTRACT

The present disclosure is related to a shift register unit. The shift register unit may include a shift register circuit and N output control circuits, wherein N is an integer larger than or
(Continued)

equal to 2. The shift register circuit may be respectively electrically connected with an input signal terminal, a clock signal terminal, and an output node. Among the N output control circuits, an i-th output control circuit may be respectively electrically connected with an i-th control signal terminal of N control signal terminals, the output node, and an i-th gate line of N gate lines. i is a positive integer of smaller than or equal to N. The shift register unit may be configured to sequentially output a gate driving signal to the N gate lines respectively under control of the N control signal terminals.

11 Claims, 8 Drawing Sheets

(52) U.S. Cl.
CPC ............... *G09G 2300/0426* (2013.01); *G09G 2310/0202* (2013.01); *G09G 2310/0267* (2013.01); *G09G 2310/0286* (2013.01); *G09G 2310/08* (2013.01); *G09G 2330/02* (2013.01)

(56) References Cited

U.S. PATENT DOCUMENTS

| | | |
|---|---|---|
| 2016/0180800 A1 | 6/2016 | Zheng |
| 2016/0253975 A1 | 9/2016 | Yang et al. |
| 2017/0039968 A1 | 2/2017 | Chen et al. |

FOREIGN PATENT DOCUMENTS

| | | |
|---|---|---|
| CN | 104732939 A | 6/2015 |
| CN | 106023949 A | 10/2016 |
| JP | 4893879 B2 | 3/2012 |
| JP | 2015-143844 A | 8/2015 |
| KR | 20160094462 A | 8/2016 |
| WO | 2018/028195 A1 | 2/2018 |

OTHER PUBLICATIONS

Office Action dated Feb. 3, 2020, issued in counterpart CN Application No. 201710700666.1, with English Translation. (34 pages).
Search Report dated Apr. 8, 2021, issued in counterpart EP Application No. 18783354.6. (10 pages).

* cited by examiner

GATE CONTROL UNIT, DRIVING METHOD THEREOF, GATE DRIVER ON ARRAY AND DISPLAY APPARATUS

CROSS-REFERENCE TO RELATED APPLICATIONS

This application claims benefit of the filing date of Chinese Patent Application No. 201710700666.1 filed on Aug. 16, 2017, the disclosure of which is hereby incorporated by reference.

TECHNICAL FIELD

This disclosure relates to display technology, and more particularly, to a shift register unit, driving method thereof, a gate driver on array and a display apparatus.

BACKGROUND

When a display apparatus displays an image, a Gate Driver on Array (GOA) needs scan pixel units row-by-row. The GOA generally comprises a plurality of cascaded shift register units. Each of the shift register units is used for driving a row of pixel units, and the plurality of shift register units are used for realizing line-by-line scanning and driving of multiple rows of pixel units in the display apparatus.

In related prior art, a shift register unit usually uses a plurality of transistors and capacitors to control electric potential of output gate driving signals. The shift register unit generally includes too many elements. As such, the GOA occupies a relatively large layout area in a display apparatus. This is disadvantageous for narrowing display borders of the display apparatus.

BRIEF SUMMARY

Accordingly, one example of the present disclosure is a shift register unit. The shift register unit may comprise a shift register circuit and N output control circuits, wherein N is an integer larger than or equal to 2. The shift register circuit may be respectively electrically connected with an input signal terminal, a clock signal terminal and an output node. Among the N output control circuits, an i-th output control circuit may be respectively electrically connected with an i-th control signal terminal of N control signal terminals, the output node, and an i-th gate line of N gate lines. i is a positive integer of smaller than or equal to N. The shift register unit may be configured to sequentially output a gate driving signal to the N gate lines respectively under control of the N control signal terminals.

In one embodiment, the shift register circuit may be configured to output the gate driving signal to the output node under control of an input signal from the input signal terminal and a clock signal from the clock signal terminal. The i-th output control circuit may be configured to output the gate driving signal to the i-th gate line under control of an i-th control signal from the i-th control signal terminal.

The shift register unit may further comprise N reset circuits. Among the N reset circuits, an i-th reset circuit may be respectively electrically connected with an i-th reset signal terminal of N reset signal terminals, a power supply signal terminal, and the i-th gate line, The i-th reset circuit may be configured to output a power supply signal from the power supply signal terminal to the i-th gate line under control of an i-th reset signal from the i-th reset signal terminal. The i-th output control circuit may comprise a first transistor. A gate electrode of the first transistor may be electrically connected with the i-th control signal terminal. A first electrode of the first transistor may be electrically connected with the output node. A second electrode of the first transistor may be electrically connected with the i-th gate line.

The i-th reset circuit may comprise a second transistor. A gate electrode of the second transistor may be electrically connected with the i-th reset signal terminal. A first electrode of the second transistor may be electrically connected with the power supply signal terminal. A second electrode of the second transistor may be electrically connected with the i-th gate line. The shift register unit may comprise a first output control circuit and a second output control circuit. The second output control circuit may further comprise a third transistor. A gate electrode and a first electrode of the third transistor may be electrically connected with the output node, a second electrode of the third transistor may be electrically connected with a first electrode of a first transistor of the second output control circuit.

Among first (N−1) reset signal terminals of the N reset signal terminals, an i-th reset signal terminal may be electrically connected with an (i+1)-th gate line of the N gate lines. The N-th reset signal terminal of the N reset signal terminals may be electrically connected with a first gate line of a shift register unit of next stage.

The shift register circuit may comprise an input sub-circuit, an output sub-circuit, and a pull-down sub-circuit. The input sub-circuit may be respectively electrically connected with the input signal terminal and the pull-up node, and may be configured to control electric potential of the pull-up node under control of an input signal from the input signal terminal. The output sub-circuit may be respectively electrically connected with a first clock signal terminal, the pull-up node, and the output node, and may be configured to output the gate driving signal to the output node under control of the electric potential of the pull-up node and a first clock signal from the first clock signal terminal. The pull-down sub-circuit may be respectively electrically connected with the input signal terminal, a second clock signal terminal, the power supply signal terminal, a reset terminal, the pull-up node and the output terminal, and may be configured to output the power supply signal from the power supply signal terminal to the pull-up node and the output node respectively under control of the input signal, a second clock signal from the second clock signal terminal and a reset signal from the reset signal terminal.

Another example of the present disclosure is a driving method of a shift register unit. The shift register unit may comprise a shift register circuit and N output control circuits. The N output circuits may be electrically connected with N control signal terminals in a one-to-one correspondence and with N gate lines in a one-to-one correspondence respectively. The method may comprise an input stage and an output stage, the output stage comprising N sub-output stages. In the input stage, an input signal terminal may provide an input signal of a first potential to charge the shift register circuit. In the output stage, a clock signal terminal may provide a clock signal of a first potential, and the shift register circuit outputs a gate driving signal to an output node under control of the clock signal. In an i-th sub-output stage of the N sub-output stages, an i-th control signal terminal of the N control signal terminals may provide an i-th control signal of a first potential, and an i-th output control circuit may output the gate driving signal to an i-th gate line of the N gate lines under control of the i-th control signal. The N control signal terminals may sequentially output a control signal of a first potential, and the first potential is an effective potential.

The shift register unit may further comprise N reset circuits. The N reset circuits may be electrically connected with N reset signal terminals in a one-to-one correspondence and the N gate lines in a one-to-one correspondence respectively. The method may further comprise N reset stages. In an i-th reset stage of the N reset stages, an i-th reset signal terminal in the N reset signal terminals may provide an i-th reset signal of a first potential, and an i-th reset circuit in the N reset circuits may output a power supply signal from a power supply signal terminal to the i-th gate line under control of the i-th reset signal. The power supply signal may be a second potential. Among the first (N−1) reset signal terminals of the N reset signal terminals, the i-th reset signal terminal may be electrically connected with an (i+1)-th gate line of the N gate lines. Among the first (N−1) reset stages of the N reset stages, the i-th reset stage and an (i+1)-th sub-output stage in the N sub-output stages may be simultaneously executed.

Another example of the present disclosure is a gate driver on array comprising at least two cascaded shift register units according to one embodiment of the present disclosure. In each of the shift register units, the N-th reset signal terminal may be electrically connected with a first gate line of shift register unit of the next stage. The i-th control signal terminal connected with the i-th output control circuit in each of the shift register units may be the same control signal terminal.

Another example of the present disclosure is a display apparatus comprising the gate driver on array according to one embodiment of the present disclosure.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

Figure 1:
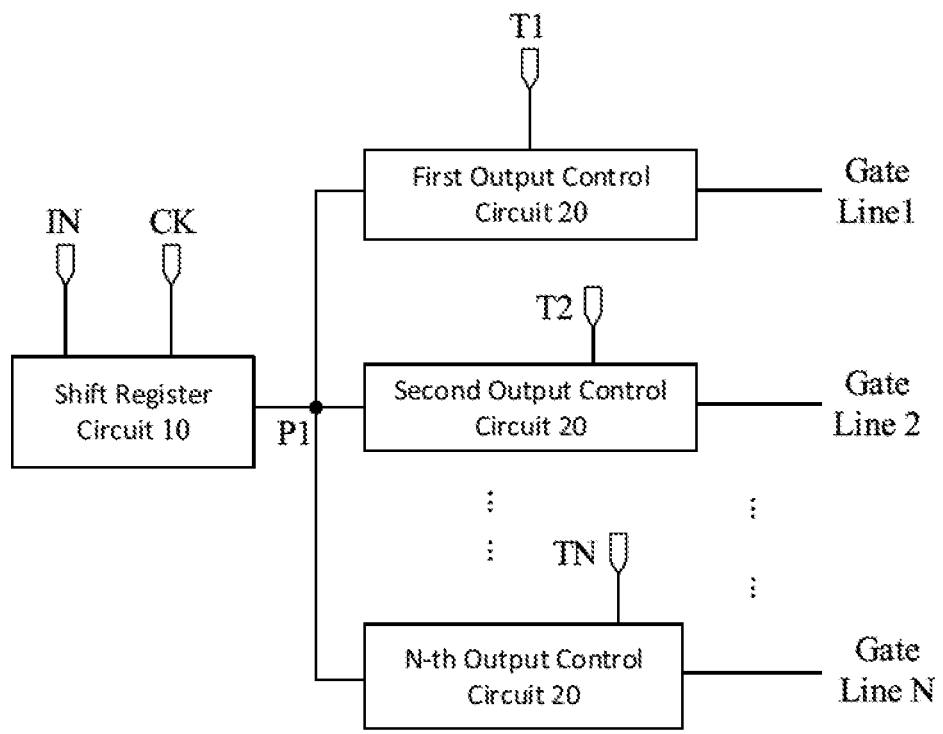
FIG. 1 is a schematic structural diagram of a shift register unit according to one embodiment of the present disclosure.

The present disclosure will be described in further detail with reference to the accompanying drawings and embodiments in order to provide a better understanding by those skilled in the art of the technical solutions of the present disclosure. Throughout the description of the disclosure, reference is made to FIGS. 1-10. When referring to the figures, like structures and elements shown throughout are indicated with like reference numerals.

The transistors in embodiments of the present disclosure are thin film transistors, field effect transistors or other apparatus with the same characteristics. The transistors in embodiments of the present disclosure are mainly switch transistors based on their function in the circuit. Because a source electrode and a drain electrode of the switch transistor are symmetric, the source electrode and the drain electrode thereof are interchangeable in embodiments of the present disclosure. Furthermore, the source electrode is termed as a first electrode; the drain electrode is termed as a second electrode. According to the form of transistor in the figures, a middle terminal of the transistor is a gate electrode, a signal input terminal thereof is the source electrode, and a signal output terminal thereof is the drain electrode. The switch transistors in the embodiments of the present disclosure include any one of a p-type switch transistor and an n-type switch transistor. The p-type switch transistor is turned on when the gate electrode thereof is at a low level and turned off when the gate electrode thereof is at a high level. The n-type switch transistor is turned on when the gate electrode thereof is at a high level and turned off when the gate electrode thereof is at a low level. In addition, each of the plurality of signals in various embodiments of the present disclosure has a first potential and a second potential. In the whole text, the first potential and the second potential represent only two states of electric potentials of the signal. It doesn't represent that the first electric potential or the second electric potential has a specific value. In this specification, the terms "first" and "second" are added as prefixes. These prefixes, however, are only added in order to distinguish the terms and do not have specific meaning such as order and relative merits.

FIG. 1 is a schematic structural diagram of a shift register unit according to one embodiment of the present disclosure. As shown in FIG. 1, the shift register unit comprises a shift register circuit 10 and N output control circuits 20. The N is an integer greater than or equal to 2. That is, there are at least two output control circuits 20 in the shift register unit.

The shift register circuit 10 is electrically connected with an input signal terminal IN, a clock signal terminal CK and an output node P1 respectively. Under a control of an input signal from the input signal terminal IN and a clock signal from the clock signal terminal CK, the shift register circuit is used for outputting a gate driving signal to the output node P1.

Among the N output control circuits 20, the i-th output control circuit 20 is respectively electrically connected to the i-th control signal terminal of N control signal terminals, the output node P1, and the i-th gate line of N gate lines. When the i-th control signal provided by the i-th control signal terminal is at the first potential, the output node P1 outputs a gate driving signal to the i-th gate line. "I" is a positive integer of smaller than or equal to N.

For example, in the structure shown in FIG. 1, the first output control circuit 20 is respectively connected to the output node P1, a first control signal terminal T1 of N control signal terminals and a first gate line of N gate lines, Gate Line 1. The N-th output control circuit is respectively electrically connected to the output node P1, the N-th control signal terminal TN of the N control signal terminals, and the N-th gate line of the N gate lines, Gate Line N.

The N control signal terminals T1 to TN sequentially output a control signal at a first potential. Furthermore, when the i-th control signal provided by the i-th control signal terminal is the first potential, control signals provided by other control signal terminals except the i-th control signal terminal are at the second potential. The first potential is an effective potential.

One embodiment of the present disclosure is a shift register unit. The shift register unit comprises N output control circuits. Under control of one control signal terminal, each of the output control circuits outputs a gate driving signal to a gate line. Therefore, the shift register unit can sequentially output a gate driving signal to the N gate lines respectively under the control of N control signal terminals. That is, one shift register unit can control multiple gate lines, thereby reducing significantly the number of shift register units in the OOA. As a result, the occupied area of the GOA is effectively reduced, which facilitates narrow frame of the display apparatus.

Figure 2:
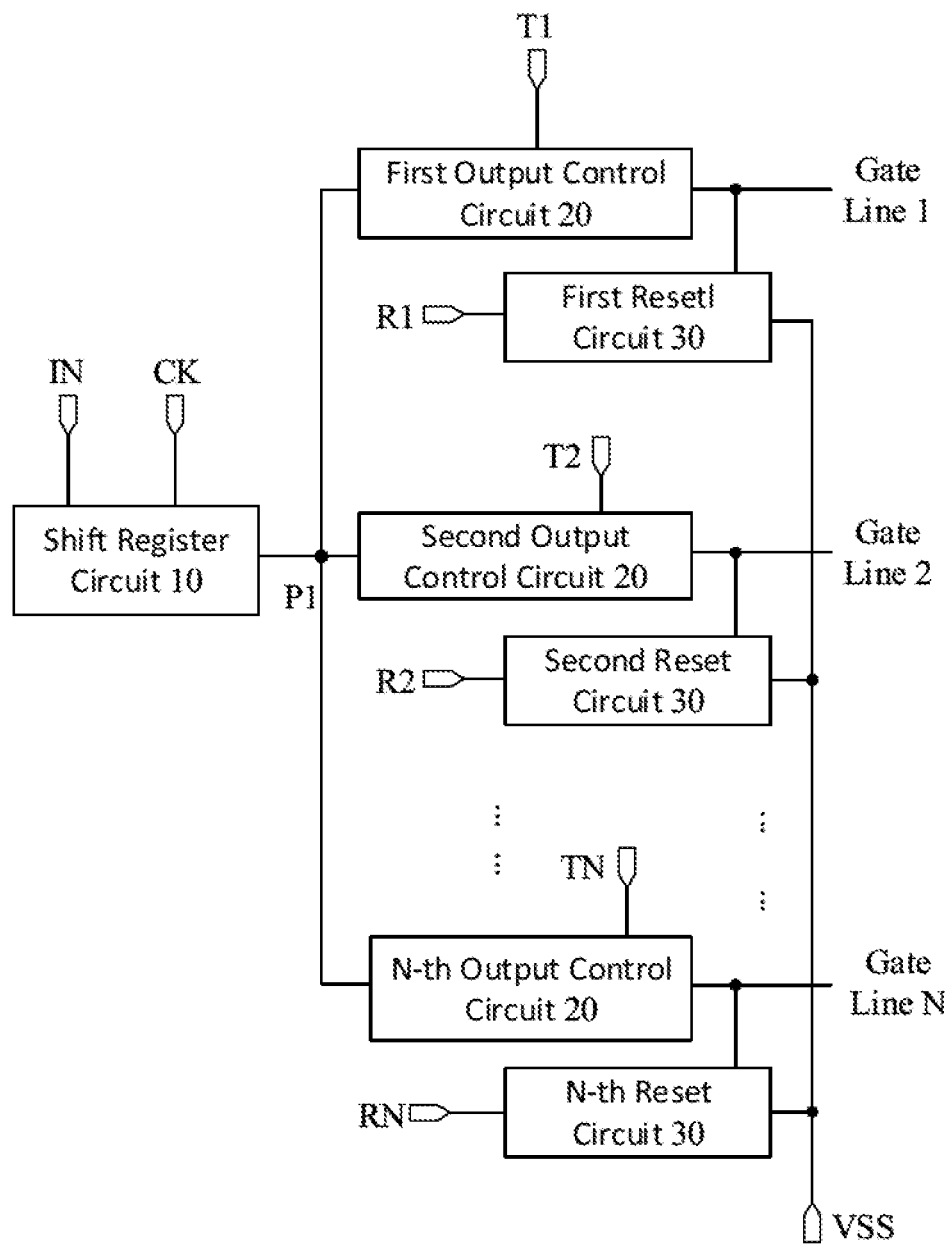
FIG. 2 is a schematic structural diagram of a shift register unit according to one embodiment of the present disclosure.

FIG. 2 is a schematic structural diagram of a shift register unit according to one embodiment of the present disclosure. As shown in FIG. 2, the shift register unit further comprises N reset circuits 30.

Among the N reset circuits 30, the i-th reset circuit 30 is respectively electrically connected to the i-th reset signal terminal of the N reset signal terminals, a power supply signal terminal VSS, and the i-th gate line. When the i-th reset signal provided by the i-th reset signal terminal is at a first potential, the i-th reset signal terminal outputs a power supply signal from the power supply signal terminal VSS to the i-th gate line. The power supply signal is at a second potential.

For example, in the structure shown in FIG. 2, the first reset circuit is respectively electrically connected to the first reset signal terminal R1 of the N reset signal terminals and the first gate line of the N gate lines: Gate Line 1. The second reset circuit is respectively electrically connected to the second reset signal terminal R2 of the N reset signal terminals and the second gate line in the N gate lines: Gate Line 2.

When the i-th control signal is changed from a first potential to a second potential, the i-th reset signal provided by the i-th reset signal terminal is changed from the second potential to the first potential. That is, when the i-th output control circuit stops outputting a gate driving signal to the i-th gate line, the i-th reset circuit starts to reset the i-th gate line, so that the i-th gate line is prevented from influencing signals outputted on the other gate lines.

Figure 3:
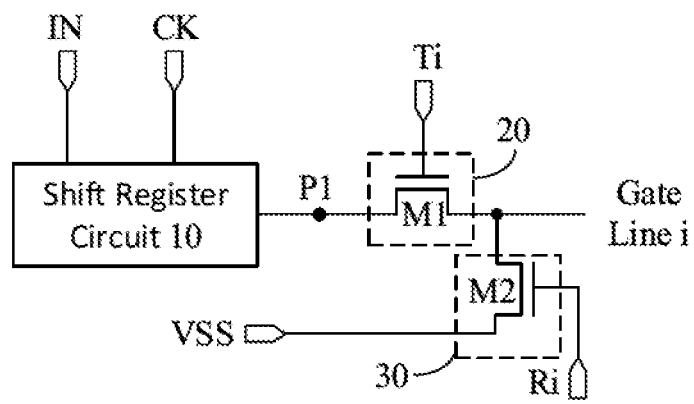
FIG. 3 is a partial structure diagram of a shift register unit according to an embodiment of the present disclosure.

FIG. 3 is a partial structure diagram of a shift register unit according to one embodiment of the present disclosure. As shown in FIG. 3, the i-th output control circuit 20 includes a first transistor M1.

In one embodiment, a gate electrode of the first transistor M1 is electrically connected with the i-th control signal terminal Ti. A first electrode of the first transistor M is electrically connected with the output node P1. A second electrode of the first transistor M1 is electrically connected with the i-th gate line, Gate Line i. When the i-th control signal provided by the i-th control signal terminal Ti is at a first potential, the first transistor M1 is turned on, and the output node P1 outputs a gate driving signal to the Gate Line i.

Further, as shown in FIG. 3, the i-th reset circuit 30 includes a second transistor M2.

In one embodiment, a gate electrode of the second transistor M2 is electrically connected with the i-th reset signal terminal Ri. A first electrode of the second transistor M2 is electrically connected with the power supply signal terminal VSS. A second electrode of the second transistor M2 is electrically connected with the i-th gate line, Gate Line i. When the i-th reset signal provided by the i-th reset signal terminal Ri is at a first potential, the second transistor M2 is turned on, and outputs a power supply signal from the power supply signal terminal VSS to the Gate Line i. The Gate Line i is reset because the power supply signal is at a second potential.

Figure 4:
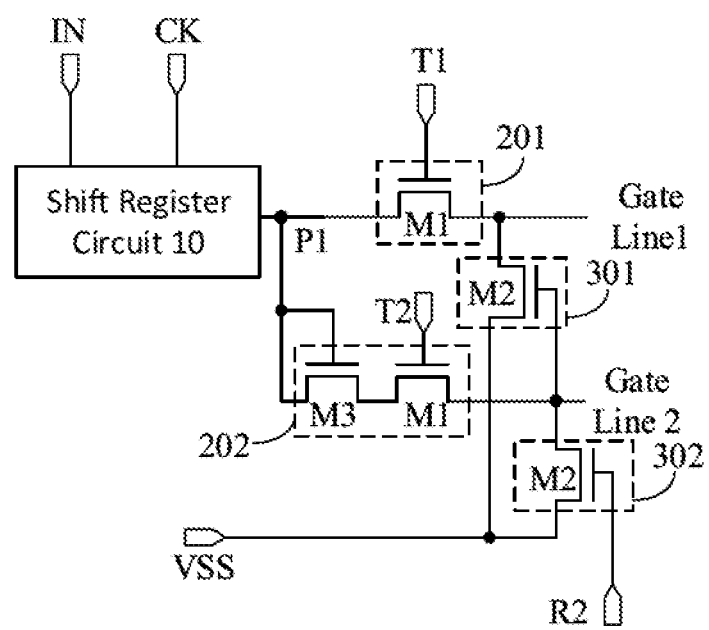
FIG. 4 is a schematic structural diagram of a shift register unit according to one embodiment of the present disclosure.

FIG. 4 is a schematic structural diagram of one shift register unit according to one embodiment of the present disclosure. As shown in FIG. 4, the shift register unit comprises two output control circuits, namely a first output control circuit 201 and a second output control circuit 202. In addition to a first transistor M1, the second output control circuit 202 may further comprise a third transistor M3.

In one embodiment, a gate electrode and a first electrode of the third transistor M3 are electrically connected with the output node P1. A second electrode of the third transistor M3 is electrically connected with the first electrode of the first transistor M1 of the second output control circuit 202. Correspondingly, the first electrode of the first transistor M1 of the second output control circuit 202 is electrically connected with the output node P1 through the third transistor M3.

When the potential of the output node P1 is at a first potential, the third transistor M3 is turned on. As such, the third transistor M3 can store the electric potential of the output node P1 to the connection point between the first transistor M1 and the third transistor M3, namely the first electrode of the first transistor M1. As a result, when the first transistor M1 is turned on under the control of the second control signal, the electric potential of the output node P1 can be outputted to the Gate Line 2, that is, a gate driving signal is outputted to the Gate Line 2.

Further, in one embodiment of the present disclosure, in the first (N−1) reset signal terminals of the N reset signal terminals, the i-th reset signal terminal is electrically connected with the (i+1)-th gate line of the N gate lines.

The N-th reset signal terminal of the N reset signal terminals is electrically connected with a first gate line of the next stage of shift register unit.

As shown in FIG. 4, in one embodiment, the shift register unit comprises two output control circuits 201 and 202, and two reset circuits 301 and 302. The first reset circuit 301 is electrically connected with the first reset signal terminal, and the second reset circuit 302 is electrically connected with the second reset signal terminal R2. As shown in FIG. 4, the first reset signal terminal used for controlling the first reset circuit 301 is electrically connected with the second gate line: Gate Line 2. The second reset signal terminal R2 used for controlling the second reset circuit 302 is electrically connected with a first gate line of the next stage of shift register unit, which is not shown in the figure.

Since the N gate lines can output sequentially a gate driving signal of a first potential under the control of N output control circuits, when the i-th reset signal terminal is electrically connected with the (i+1) gate line, the N reset signal terminals can be guaranteed to sequentially output a reset signal at the first potential. Furthermore, the time sequences of the i-th reset signal and the signal transmitted on the (i+1)-th gate line are the same. Furthermore, when the i-th control signal is changed from the first potential to the second potential, electric potential of the signal transmitted on the i-th gate line is changed from the first potential to the second potential, so that the i-th reset signal is changed from the second potential to the first potential.

Figure 5:
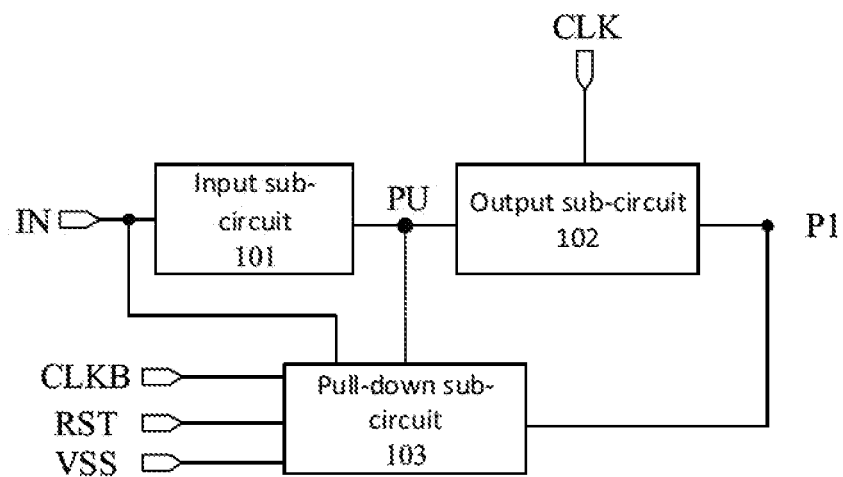
FIG. 5 is a schematic structural diagram of a shift register circuit according to one embodiment of the present disclosure.

FIG. 5 is a schematic structural diagram of a shift register circuit according to one embodiment of the present disclosure. As shown in FIG. 5, the shift register circuit 10 is electrically connected with two clock signal terminals. In one embodiment, it is electrically connected with the first clock signal terminal CLK and the second clock signal terminal CLKB. The shift register circuit 10 comprises an input sub-circuit 101, an output sub-circuit 102, and a pull-down sub-circuit 103.

The input sub-circuit 101 is respectively electrically connected with the input signal terminal IN and the pull-up node PU. Under control of an input signal from the input signal terminal IN, the input sub-circuit 101 is used for controlling electric potential of the pull-up node PU.

The output sub-circuit 102 is electrically connected with the first clock signal terminal CLK, the pull-up node PU and the output node P1 respectively. Under control of the pull-up node PU and the first clock signal from the first clock signal terminal CLK, the output sub-circuit 102 is used to output the gate driving signal to the output node P1.

The pull-down sub-circuit 103 is respectively electrically connected with the input signal terminal IN, a second clock signal terminal CLKB, a power supply signal terminal VSS, a reset terminal RST, the pull-up node PU, and an output terminal thereof. The pull-down sub-circuit 103 is used for outputting a power supply signal from the power supply signal terminal VSS to the pull-up node PU and the output node P1 respectively under the control of the input signal, a second clock signal from the second clock signal terminal CLKB and a reset signal from the reset terminal RST. The power supply signal is at a second potential, so that the pull-up node PU and the output node P1 can be reset.

Figure 6:
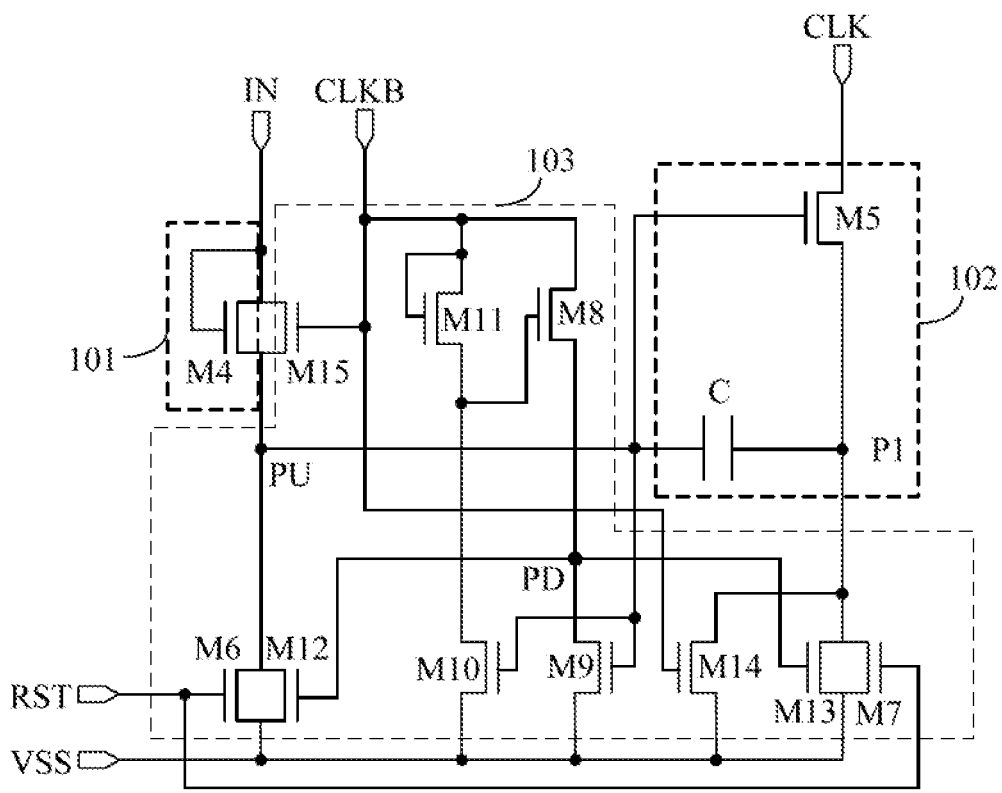
FIG. 6 is a schematic structural diagram of a shift register circuit according to one embodiment of the present disclosure.

FIG. 6 is a schematic structural diagram of a shift register circuit according to one embodiment of the present disclosure. As shown in FIG. 6, the input sub-circuit 101 in the shift register circuit includes a fourth transistor M4. The output sub-circuit 102 includes a fifth transistor M5 and a capacitor C. The pull-down sub-circuit 103 includes ten transistors, which are the sixth transistor M6 to the fifteenth transistor M15.

A gate electrode and a first electrode of the fourth transistor M4 are electrically connected with the input signal terminal IN. A second electrode of the fourth transistor M4 is electrically connected with the pull-up node PU.

A gate electrode of the fifth transistor M5 is electrically connected with the pull-up node PU. A first electrode of the fifth transistor M5 is electrically connected with the first clock signal terminal CLK. A second electrode of the fifth transistor M5 is electrically connected with the output node P1.

One terminal of the capacitor C is electrically connected with the pull-up node PU. The other terminal of the capacitor C is electrically connected with the output node P1.

A gate of the sixth transistor M6 is electrically connected to the reset terminal RST. A first electrode of the sixth transistor M6 is electrically connected with the power signal terminal VSS. A second electrode of the sixth transistor M6 is electrically connected with the pull-up node PU.

A gate of the seventh transistor M7 is electrically connected with the reset terminal RST. A first electrode of the seventh transistor M7 is electrically connected with the power supply signal terminal VSS. A second electrode of the seventh transistor M7 is electrically connected with the output node P1.

A gate of the eighth transistor M8 is electrically connected with the second electrode of the tenth transistor M10 and the second electrode of the eleventh transistor M11. A first electrode of the eighth transistor M8 is electrically connected with the second clock signal terminal CLKB. A second electrode of the eighth transistor M8 is electrically connected with the pull-down node PD.

A gate electrode of the ninth transistor M9 is electrically connected with the pull-up node PU. A first electrode of the ninth transistor M9 is electrically connected with the power signal terminal VSS. A second electrode of the ninth transistor M9 is electrically connected with the pull-down node PD.

A gate electrode of the tenth transistor M10 is electrically connected with the pull-up node PU. A first electrode of the tenth transistor M10 is electrically connected with the power signal terminal VSS. A second electrode of the tenth transistor M10 is electrically connected with the gate electrode of the eighth transistor M8.

A gate electrode and a first electrode of the eleventh transistor M11 are electrically connected with the second clock signal terminal CLKB. A second electrode of the eleventh transistor M11 is electrically connected with the gate electrode of the eighth transistor M8.

A gate electrode of the twelfth transistor M12 is electrically connected with the pull-down node PD, and a first electrode of the twelfth transistor M12 is electrically connected with the power supply signal terminal VSS. A second electrode of the twelfth transistor m12 is electrically connected with the pull-up node PU.

A gate electrode of the thirteenth transistor M13 is electrically connected with the pull-down node PD, and a first electrode of the thirteenth transistor M13 is electrically connected with the power signal terminal VSS. A second electrode of the thirteenth transistor M13 is electrically connected with the output node P1.

A gate electrode of the fourteenth transistor M14 is electrically connected with the second clock signal terminal CLKB. A first electrode of the fourteenth transistor M14 is electrically connected with the power signal terminal VSS. A second electrode of the fourteenth transistor M14 is electrically connected with the output node P1.

A gate electrode of the fifteenth transistor M15 is electrically connected with the second clock signal terminal CLKB. A first electrode of the fifteenth transistor M15 is electrically connected with the input signal terminal IN, and a second electrode of the fifteenth transistor M15 is electrically connected with the pull-up node PU.

The shift register circuit in the shift register according to one embodiment of the present disclosure has the structure as shown in FIG. 6. Other structures may also be adopted. In one embodiment, a structure of an alternating current reset model is adopted. That is, an alternating current signal is adopted as a reset control signal. In another embodiment, a structure of a direct current reset model can be adopted. That is, a direct current signal is adopted as a reset control signal. Embodiments of the present disclosure are not limited herein.

According to one embodiment of the current disclosure, a shift register unit is provided. The shift register unit comprises N output control circuits. Each of the output control circuits outputs a gate driving signal to a gate line under control of one control signal terminal. Therefore, the shift register unit can sequentially output a gate driving signal to the N gate lines under control of N control signal terminals. That is, one shift register unit can control multiple gate lines. As such, the number of shift register units in the GOA can be greatly reduced, thereby reducing significantly the occupied area of the GOA and facilitating narrow frame of the display apparatus. In addition, pixel density of the display apparatus is improved while resolution of the display apparatus is not reduced.

Figure 7:
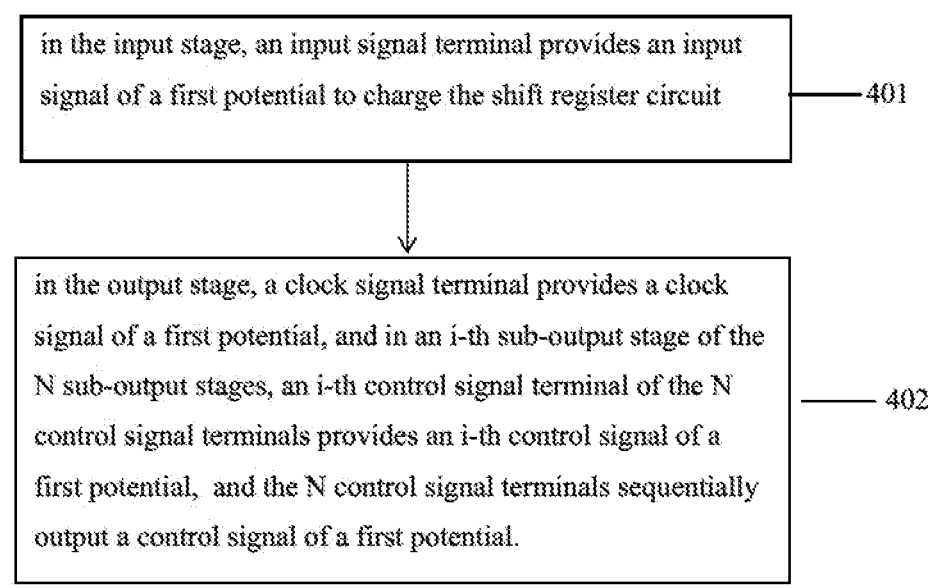
FIG. 7 is a flowchart of a driving method for a shift register unit according to one embodiment of the present disclosure.

FIG. 7 is a flowchart of a method of driving a shift register unit according to one embodiment of the present disclosure. The method is used for driving the shift register unit shown in any one of FIGS. 1-4. As shown in FIG. 1 to FIG. 4, the shift register unit comprises a shift register circuit 10 and N output control circuits 20. The N output circuits are electrically connected with the N control signal terminals in a one-to-one correspondence as well as with the N gate lines in a one-to-one correspondence. The driving method comprises an input stage and an output stage. The output stage comprises N sub-output stages. Referring to FIG. 7, the method is as follows:

In Step 401, in an input stage, an input signal provided by an input signal terminal IN is at a first potential, and the input signal terminal IN is used for charging the shift register circuit 10.

In Step 402, in an output stage, a clock signal provided by a clock signal terminal is at a first potential. The shift register circuit 10 outputs a gate drive signal to an output node thereof under the control of the clock signal. In the i-th sub-output stage of the output stage, the i-th control signal provided by the i-th control signal terminal of the N control signal terminals is at a first potential. The control signals provided by other control signal terminals except the i-th control signal terminal are at a second potential. The i-th output control circuit in the N output control circuits outputs a gate driving signal to the i-th gate line of the N gate lines under control of the i-th control signal.

Wherein, the N control signal terminals can sequentially output a control signal at a first potential respectively. The first potential is an effective potential, and therefore it is ensured that the N output control circuits can sequentially execute an output stage respectively.

In one embodiment, as shown in FIGS. 2-4, the shift register unit further comprises N reset circuits 30. The N reset circuits 30 are electrically connected with the N reset signal terminals in a one-to-one correspondence. Accordingly, the driving method further comprises N reset stages.

In the i-th reset stage of the N reset stages, the i-th reset signal provided by the i-th reset signal terminal of the N reset signal terminals is at a first potential. The i-th reset circuit 30 of the N reset circuits 30, under control of the i-th reset signal, outputs a power supply signal from a power supply signal terminal VSS to the i-th gate line. The power supply signal is at a second potential.

Wherein, when the i-th control signal is changed from a first potential to a second potential, the i-th reset signal provided by the i-th reset signal terminal is changed from a second potential to a first potential. That is, the i-th reset stage is executed after the i-th sub-output stage is completed.

Furthermore, in the shift register unit according to one embodiment of the present disclosure, in the first (N−1) reset signal terminals of the N reset signal terminals, the i-th reset signal terminal thereof is electrically connected with the (i+1) gate line of the N gate lines. Therefore, in the first (N−1) reset stages of the N reset stages, the i-th reset stage and the (i+1)-th sub-output stage of the N sub-output stages are simultaneously executed. The N-th reset stage is executed at the same time as the first sub-output stage of the next-stage of shift register unit.

Figure 8:
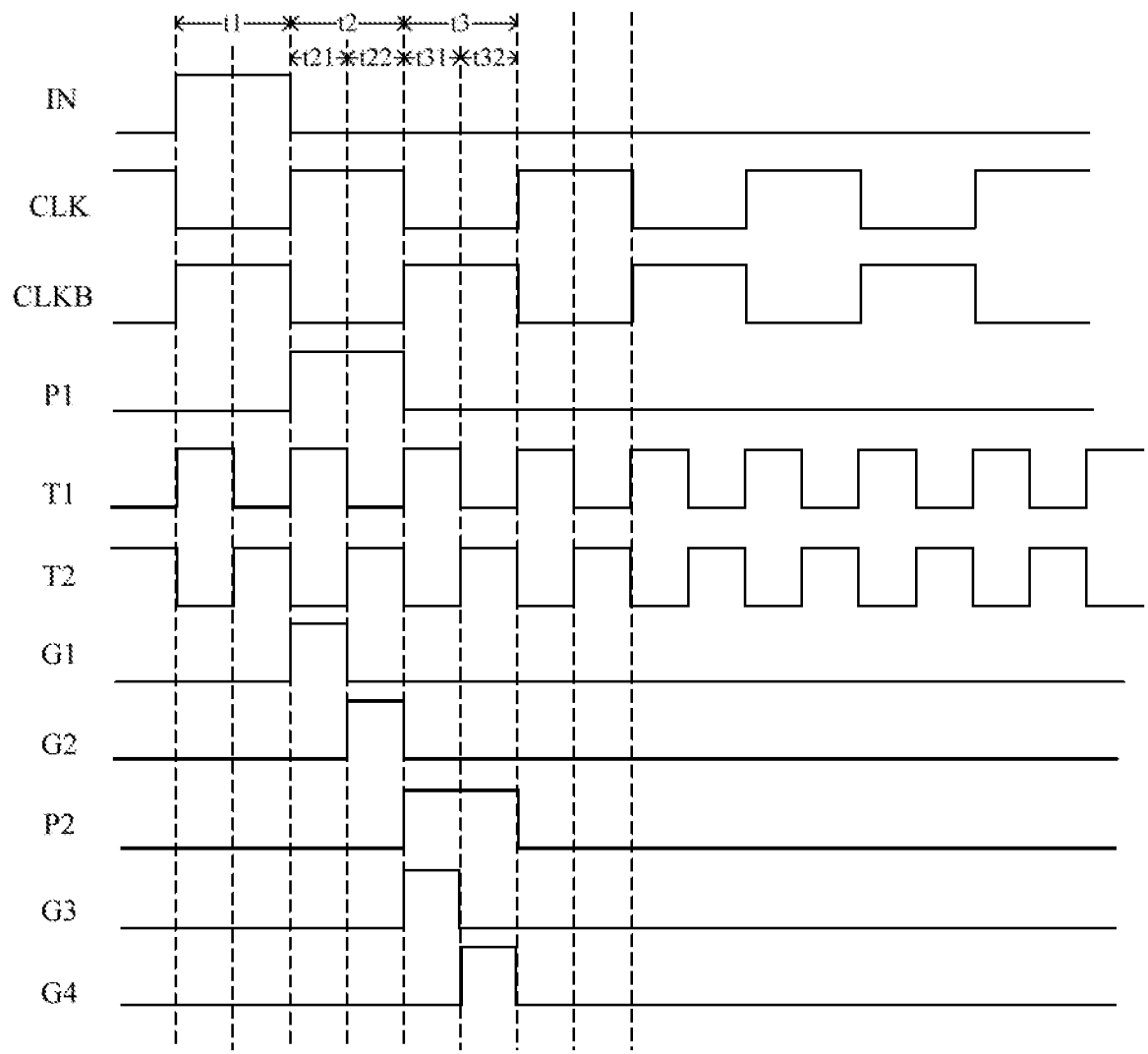
FIG. 8 is a timing diagram of each signal terminal in a shift register unit according to one embodiment of the present disclosure.

FIG. 8 is a timing diagram of signal terminals in a shift register unit according to one embodiment of the present disclosure. Taking the shift register unit as shown in FIG. 4 and the shift register circuit shown in FIG. 6 as an example, the driving method of the shift register unit provided by the embodiment of the present disclosure is described in detail as below:

As shown in FIG. 8, in input stage t1, an input signal provided by an input signal terminal IN and a second clock signal provided by a second clock signal terminal CLKB are at a first potential. A first clock signal provided by a first clock signal terminal CLK is at a second potential. As shown in FIG. 6, the fourth transistor M4, the fifteenth transistor M15, and the fourteenth transistor M14 are turned on. The input signal terminal IN outputs the input signal to the pull-up node PU and charges the pull-up node PU. Meanwhile, the power supply signal terminal VSS outputs a power supply signal of the second potential to the output node P1. Further, under the control of the pull-up node PU, the fifth transistor M5, the ninth transistor M9 and the tenth transistor M10 are turned on. The first clock signal terminal CLK outputs a first clock signal of the second potential to the output node P1. The power supply signal terminal VSS outputs a power supply signal to the pull-down node PD and the gate electrode of the eighth transistor M8 respectively, so that the eighth transistor M8, the twelfth transistor M12 and the fourteenth transistor M13 are turned off.

In output stage t2, the input signal provided by the signal terminal IN and the second clock signal provided by the second clock signal terminal CLKB are at a second potential. The first clock signal provided by the first clock signal terminal CLK is at a first potential, and the electric potential of the pull-up node PU is further pulled up under the bootstrap effect of the capacitor C. The fifth transistor M5 is fully opened. The first clock signal terminal CLK outputs to the output node P1 a clock signal of the first potential, namely a gate driving signal. Meanwhile, in the output stage t2, the ninth transistor M9 and the tenth transistor M10 remain at an turn-on state, the power supply signal terminal VSS outputs a power supply signal to the pull-down node PD and the eighth transistor M8 respectively so that the eighth transistor M8, the twelfth transistor M12, and the fourteenth transistor M13 are turned off, thereby avoiding influencing electric potential of the pull-up node PU and the output node P1 and ensuring a stable output of the gate driving signal.

Further, since two output control circuits 201 and 202 are included in the shift register unit, as shown in FIG. 4, the output stage t2 is divided into a first sub-output stage t21 and a second sub-output stage t22 accordingly, as shown in FIG. 8.

In the first sub-output stage t21, the first control signal outputted by the first control signal terminal T1 is at a first potential. The first transistor M1 in the first output control circuit 201 is turned on and outputs a gate driving signal from the output node P1 to the Gate Line 1, namely G1. The second control signal outputted by the second control signal terminal T2 is at the second potential at the moment. Accordingly, the first transistor M1 in the second output control circuit 202 is turned off. No signal is output on the Gate Line 2, namely G2. The second output control circuit 202 may further comprise a third transistor M3. Under the control of the output node P1, the third transistor M3 may remain turned on all the time in the output stage t2 so that the electric potential of the output node P1 is stored in the first electrode of the first transistor M1 of the second output control circuit 202.

Referring to FIG. 8, in the second sub-output stage t22, the second control signal outputted by the second control signal terminal T2 is at a first potential. The first control signal outputted by the first control signal terminal T1 is at a second potential. At this moment, the first transistor M1 of the second output control circuit 202 is turned on. The first transistor M1 of the first output control circuit 201 is turned off. The output node P1 outputs a gate driving signal to the G2. At this moment, no driving signal is outputted on G1.

Further, as shown in FIG. 4, the gate electrode, namely the first reset signal terminal, of the second transistor M2 in the first reset circuit 301 is electrically connected with the Gate Line 2. As such, when the output node P1 outputs a gate driving signal at the first potential to the Gate Line 2, the second transistor M2 in the first reset circuit 301 is turned on. The power supply signal terminal VSS outputs a power supply signal at the second potential to the gate line G1 so that the gate line G1 is reset. Therefore, the second sub-output stage t22 is also the first reset stage.

Then, as shown in FIG. 8, the next stage of shift register unit starts executing an output stage t3. The output stage t2 of the present stage of shift register unit is also the input stage of the next stage of the shift register unit. In the output stage t3, the shift register circuit in the next stage of the shift register unit can output a gate drive signal to the output node P2. As shown in FIG. 8, if the next stage of the shift register unit also comprises two output control circuits, and the two output control circuits are also respectively controlled by the first control signal terminal T1 and the second control signal terminal T2, then the output stage t3 of the next-stage of the shift register unit may also be divided into a first sub-output stage t31 and a second sub-output stage t32. In the first sub-output stage t31, the first control signal outputted by the first control signal terminal T1 is at a first potential. The first output control circuit may output a gate driving signal from the output node P2 to the gate line G3. In the second sub-output stage t32, the second control signal outputted by the second control signal terminal T2 is at a first potential. The second output control circuit may output a gate driving signal from the output node P2 to the gate line G4.

Since the reset signal terminal in the second reset circuit of the shift register unit of the present stage connects with the first gate line of shift register unit of the next stage, for example, Gate Line G3 shown in FIG. 8, the first sub-output stage of shift register unit of the next stage is also the last reset stage of the shift register unit of the present stage.

For example, in the time sequence shown in FIG. 8, in the first sub-output stage t31 of shift register unit of the next stage, the electric potential of the gate driving signal transmitted on the gate line G3 is at a first potential. The second transistor M2 in the second reset circuit 302 of the shift register unit of the present stage is turned on. The power supply signal terminal VSS outputs a power supply signal of the second potential to the gate line G2, and the gate line G2 is reset. That is, the first sub-output stage t31 of shift register unit of the next stage is the second reset stage of shift register unit of the present stage.

In the above embodiment, each transistor is an n-type transistor, and the first potential is a higher potential relative to the second potential. In another embodiment, the transistor is also a p-type transistor, and when the transistor is a p-type transistor, the first potential is a lower potential relative to the second potential. Moreover, the electric potential change of each signal terminal is opposite to the electric potential change shown in FIG. 8.

In one embodiment, a driving method of a shift register unit is provided. The output stage of the driving method comprises N sub-output stages. In each of the sub-output stages, an output control circuit outputs a gate driving signal to a gate line under control of a control signal terminal. Therefore, the shift register unit sequentially outputs a gate driving signal to the N gate lines respectively under control of N control signal terminals. That is, on the basis that the original driving time sequence of the shift register circuit is not changed, a shift register unit is used for controlling a plurality of gate lines. Therefore, the number of shift register units needed to be arranged in a GOA can be greatly reduced and the occupied area thereof is effectively reduced. This facilitates designing narrow frame of a display apparatus. Moreover, pixel density of the display apparatus is improved while resolution of the display apparatus is not reduced.

Figure 9:
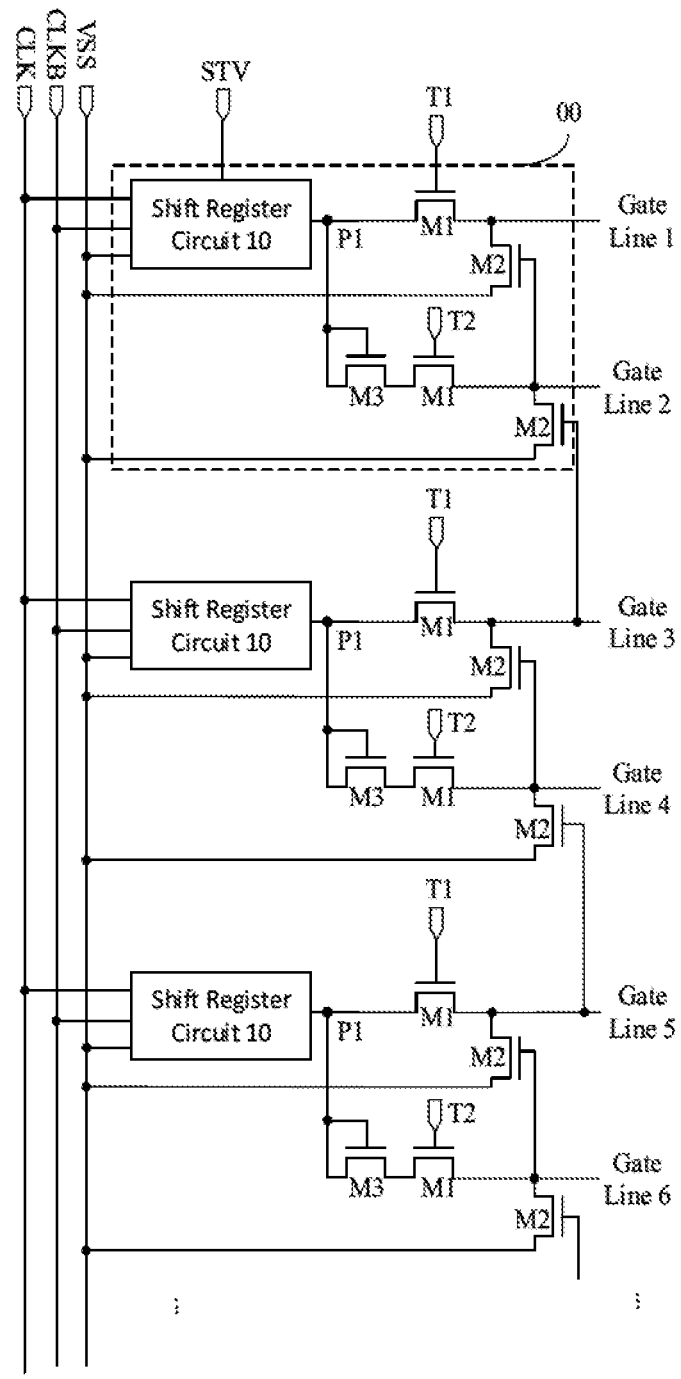
FIG. 9 is a schematic structural diagram of a GOA according to one embodiment of the present disclosure.

FIG. 9 is a schematic structural diagram of a GOA according to one embodiment of the present disclosure. As shown in FIG. 9, The GOA comprises at least two cascaded shift register units 00, wherein each of the shift register units 00 may be a shift register unit as shown in any one of FIGS. 1-4.

In each of the shift register units 00, the N-th reset signal terminal is electrically connected with a first gate line of shift register unit of the next stage.

For example, as shown in FIG. 9, each shift register unit comprises two output control circuits and two reset circuits. The reset signal terminal of the second reset circuit in each shift register unit is electrically connected with a first gate line of the shift register unit of the next stage. For example, a second reset signal terminal of the shift register unit of the first-stage is electrically connected with a first gate line, gate line 3, of the shift register unit of the second stage.

In one embodiment of the present disclosure, the i-th control signal terminal electrically connected with the i-th output control circuit in each stage of the shift register unit in the GOA may be the same signal terminal. For example, as shown in FIG. 9, each shift register unit comprises two output control circuits. The first output control circuit in each shift register unit is electrically connected with the first control signal terminal T1, and the second output control circuit in each shift register unit is electrically connected with the second control signal terminal T2.

In one embodiment, an output node P1 in each stage of shift register unit is electrically connected with an input signal terminal of shift register unit of the next stage. The output node P1 in each stage of shift register unit is also electrically connected with a reset terminal RST of the shift register unit of the previous stage. In one embodiment, the input signal terminal IN of the first-stage shift register unit is electrically connected with a frame starting signal terminal STV. As such, under control of a clock signal terminal, shift register circuits in each stage of the shift register unit sequentially shift an input signal provided by the frame starting signal terminal STV from the first stage to the last stage.

In one embodiment, time sequence of control signals outputted by N control signal terminals is determined according to time sequence of the clock signals in the shift register unit. Specifically, the frequencies and the duty ratios of control signals outputted by the N control signal terminals are the same. The frequency of each control signal may be twice the frequency of the clock signal. For example, when the frequency of the clock signal is 60 Hz, the frequency of the control signal is 120 Hz. When the frequency of the clock signal is 30 Hz, the frequency of the control signal is 60 Hz. In addition, during each clock cycle, when the clock signal is at the first potential, the N control signal terminals can sequentially output a control signal at a first potential. The total length of time when the N control signals are at the first potential is equal to the time length of the clock signal during which the clock signal is at the first potential.

Figure 10:
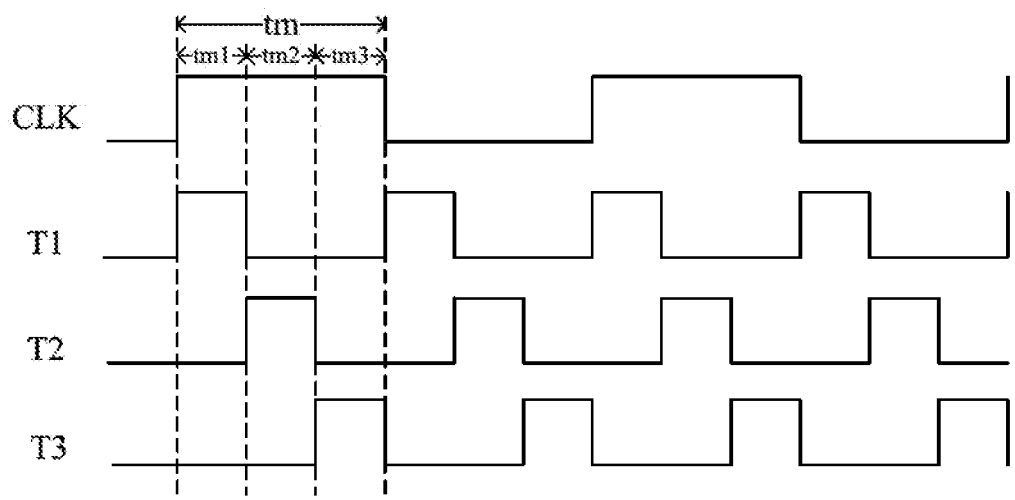
FIG. 10 is a timing diagram of a clock signal and three control signals according to one embodiment of the present disclosure.

In one embodiment, each of the shift register units includes three output control circuits. The three output control circuits are respectively electrically connected with the first control signal terminal T1, the second control signal terminal T2, and the third control signal terminal T3. FIG. 10 is a timing diagram of a clock signal and three control signals according to one embodiment of the present disclosure. As shown FIG. 10, in each clock cycle, the clock signal provided by the clock signal terminal CLK in the stage tm is at the first potential. The first control signal terminal T1, the second control signal terminal T2 and the third control signal terminal T3 can sequentially provide a control signal of the first potential. For example, electric potential of the first control signal provided by the first control signal terminal T1 during tm1 stage is at the first potential. The electric potential of the second control signal provided by the second control signal terminal T2 during tm2 stage is at the first potential. The electric potential of the third control signal provided by the third control signal terminal T3 during tm3 stage is at the first electric potential. The total duration of the three stages tm1 to tm3 is equal to the duration of each clock cycle tm of the clock signal at the first potential.

The frequency of the control signal outputted by the control signal terminal is higher than that of the clock signal, and may be three times the frequency of the clock signal. Therefore, the driving effect of 60 Hz can be achieved with a clock frequency of 20 Hz. In another embodiment, a driving effect of 120 Hz can be achieved with a 40 Hz clock frequency. When the clock signal frequency is low, the impact of voltage on internal transistors of the shift register unit can be reduced, thereby inhibiting drifting of the threshold voltage of the transistor and prolonging service life of products. Meanwhile, because high-frequency driving is facilitated, sufficient switching rate can be provided to a 3D display without reducing the resolution ratio thereof. Moreover, power consumption of the display panel is not increased.

Another example of the present disclosure is a display apparatus. The display apparatus comprises a GOA according to one embodiment of the present disclosure, for example, as shown in FIG. 9. The GOA comprises at least two cascaded shift register units as shown in any one of FIGS. 1-4. The display apparatus may be a liquid crystal panel, electronic paper, an OLED panel, an AMOLED panel, a mobile phone, a tablet computer, a television, a display, a notebook computer, a digital photo frame, a navigator or other products or components with a display function.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A shift register unit, comprising:
a shift register circuit and N output control circuits, wherein N is an integer larger than or equal to 2;
wherein the shift register circuit is respectively electrically connected with an input signal terminal, a clock signal terminal and an output node; and
among the N output control circuits, an i-th output control circuit is respectively electrically connected with an i-th control signal terminal of N control signal terminals, the output node, and an i-th gate line of N gate lines,
wherein i is a positive integer of smaller than or equal to N;
wherein the shift register unit is configured to sequentially output a gate driving signal to the N gate lines respectively under control of the N control signal terminals,
wherein the shift register unit further comprises N reset circuits; and, among the N reset circuits, an i-th reset circuit is respectively electrically connected with an i-th reset signal terminal of N reset signal terminals, a power supply signal terminal, and the i-th gate line,
wherein the reset circuit is configured to output a power supply signal from the power supply signal terminal to the i-th gate line under control of an i-th reset signal from the i-th reset signal terminal, and
the i-th reset circuit is connected directly with the i-th gate line; and
wherein among first (N-1) reset signal terminals of the N reset signal terminals, an i-th reset signal terminal is directly electrically connected with an (i±1)-th gate line of the N gate lines; and the N-th reset signal terminal of the N reset signal terminals is directly electrically connected with a first gate line of a shift register unit of next stage.

2. The shift register unit according to claim 1, wherein the shift register circuit is configured to output the gate driving signal to the output node under control of an input signal from the input signal terminal and a clock signal from the clock signal terminal, and the i-th output control circuit is configured to output the gate driving signal to the i-th gate line under control of an i-th control signal from the i-th control signal terminal.

3. The shift register unit according to claim 1, wherein the i-th output control circuit comprises a first transistor, and a gate electrode of the first transistor is electrically connected with the i-th control signal terminal, a first electrode of the first transistor is electrically connected with the output node, and a second electrode of the first transistor is electrically connected with the i-th gate line.

4. The shift register unit according to claim 3, wherein the shift register unit comprises a first output control circuit and a second output control circuit; the second output control circuit further comprises a third transistor; and
a gate electrode and a first electrode of the third transistor are electrically connected with the output node, a second electrode of the third transistor is electrically connected with a first electrode of a first transistor of the second output control circuit.

5. The shift register unit according to claim 1, wherein the i-th reset circuit comprises a second transistor; and a gate electrode of the second transistor is electrically connected with the i-th reset signal terminal, a first electrode of the second transistor is electrically connected with the power supply signal terminal, and a second electrode of the second transistor is electrically connected with the i-th gate line.

6. The shift register unit according to claim 1, wherein the shift register circuit comprises an input sub-circuit, an output sub-circuit, and a pull-down sub-circuit;

the input sub-circuit is respectively electrically connected with the input signal terminal and a pull-up node, and is configured to control electric potential of the pull-up node under control of an input signal from the input signal terminal;

the output sub-circuit is respectively electrically connected with a first clock signal terminal, the pull-up node, and the output node, and is configured to output the gate driving signal to the output node under control of the electric potential of the pull-up node and a first clock signal from the first clock signal terminal; and the pull-down sub-circuit is respectively electrically connected with the input signal terminal, a second clock signal terminal, the power supply signal terminal, a reset terminal, the pull-up node and the output terminal, and is configured to output the power supply signal from the power supply signal terminal to the pull-up node and the output node respectively under control of the input signal, a second clock signal from the second clock signal terminal and a reset signal from the reset signal terminal.

7. A gate driver on array comprising at least two cascaded shift register units as described in claim 1.

8. The gate driver on array according to claim 7, wherein, in each of the shift register units, the N-th reset signal terminal is electrically connected with a first gate line of shift register unit of the next stage.

9. The gate driver on array according to claim 7, wherein the i-th control signal terminal connected with the i-th output control circuit in each of the shift register units is the same control signal terminal.

10. A display apparatus comprising the gate driver on array according to claim 7.

11. A driving method of a shift register unit, the shift register unit comprising a shift register circuit and N output control circuits, wherein the N output circuits are electrically connected with N control signal terminals in a one-to-one correspondence and with N gate lines in a one-to-one correspondence respectively, the method comprises an input stage and an output stage, the output stage comprising N sub-output stages;

wherein, in the input stage, an input signal terminal provides an input signal of a first potential to charge the shift register circuit;

in the output stage, a clock signal terminal provides a clock signal of a first potential, and the shift register circuit outputs a gate driving signal to an output node under control of the clock signal; and in an i-th sub-output stage of the N sub-output stages, an i-th control signal terminal of the N control signal terminals provides an i-th control signal of a first potential, and an i-th output control circuit outputs the gate driving signal to an i-th gate line of the N gate lines under control of the i-th control signal, wherein the N control signal terminals sequentially output a control signal of a first potential, and the first potential is an effective potential, wherein the shift register unit further comprises N reset circuits, and the N reset circuits are electrically connected with N reset signal terminals in a one-to-one correspondence and the N gate lines in a one-to-one correspondence respectively, the method further comprises N reset stages;

wherein, in an i-th reset stage of the N reset stages, an i-th reset signal terminal in the N reset signal terminals provides an i-th reset signal of a first potential, and an i-th reset circuit in the N reset circuits outputs a power supply signal from a power supply signal terminal to the i-th gate line under control of the i-th reset signal, wherein the power supply signal is a second potential; and wherein, among first (N-1) reset signal terminals of the N reset signal terminals, the i-th reset signal terminal is directly electrically connected with an (i±1)-th gate line of the N gate lines; and among first (N-1) reset stages of the N reset stages, the i-th reset stage and an (i÷1)-th sub-output stage in the N sub-output stages are simultaneously executed.

* * * * *